(12) United States Patent
Dutartre

(10) Patent No.: US 11,978,710 B2
(45) Date of Patent: May 7, 2024

(54) INTEGRATED CIRCUIT COMPRISING A SUBSTRATE EQUIPPED WITH A TRAP-RICH REGION, AND FABRICATING PROCESS

(71) Applicant: STMicroelectronics (Crolles 2) SAS, Crolles (FR)

(72) Inventor: Didier Dutartre, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 200 days.

(21) Appl. No.: 17/359,872

(22) Filed: Jun. 28, 2021

(65) Prior Publication Data
US 2021/0327834 A1 Oct. 21, 2021

Related U.S. Application Data

(62) Division of application No. 16/278,313, filed on Feb. 18, 2019, now Pat. No. 11,075,177.

(30) Foreign Application Priority Data

Feb. 23, 2018 (FR) ...................................... 1851615

(51) Int. Cl.
*H01L 23/00* (2006.01)
*H01L 21/762* (2006.01)
*H01L 23/66* (2006.01)
*H01L 29/06* (2006.01)

(52) U.S. Cl.
CPC ........ *H01L 23/66* (2013.01); *H01L 21/76286* (2013.01); *H01L 29/0646* (2013.01); *H01L 29/0649* (2013.01); *H01L 2223/6688* (2013.01)

(58) Field of Classification Search
None
See application file for complete search history.

(56) References Cited

U.S. PATENT DOCUMENTS

| 6,121,661 | A  | * | 9/2000 | Assaderaghi | H01L 21/84 |
| | | | | | 257/104 |
| 9,431,286 | B1 | * | 8/2016 | Pendharkar | H01L 21/761 |
| 9,899,415 | B1 | * | 2/2018 | Cai | H01L 27/13 |
| 9,929,039 | B2 | * | 3/2018 | Dutartre | H01L 21/02505 |
| 10,546,747 | B2 | * | 1/2020 | Englekirk | H01L 21/02658 |

(Continued)

FOREIGN PATENT DOCUMENTS

| CN | 103151293 A | 6/2013 |
| CN | 106257641 A | 12/2016 |

(Continued)

OTHER PUBLICATIONS

Raskin, Jean-Pierre: "SOI Technology: An Opportunity for RF Designers," Journal of Telecommunications and Information Technology, Apr. 2009, 15 pages.

(Continued)

*Primary Examiner* — Ali Naraghi
(74) *Attorney, Agent, or Firm* — Crowe & Dunlevy LLC

(57) ABSTRACT

An integrated circuit includes a substrate having at least one first domain and at least one second domain that is different from the at least one first domain. A trap-rich region is provided in the substrate at the locations of the at least one second domain only. Locations of the at least one first domain do not include the trap-rich region.

17 Claims, 2 Drawing Sheets

(56) References Cited

U.S. PATENT DOCUMENTS

| | | | | |
|---|---|---|---|---|
| 2010/0230779 A1* | 9/2010 | Anderson | ............ | H01L 27/0623 |
| | | | | 257/516 |
| 2016/0372484 A1* | 12/2016 | Nguyen | ................. | H01L 23/66 |
| 2018/0069079 A1* | 3/2018 | Fanelli | .............. | H01L 21/26506 |
| 2018/0337043 A1 | 11/2018 | Englekirk et al. | | |
| 2018/0337146 A1 | 11/2018 | Englekirk et al. | | |

FOREIGN PATENT DOCUMENTS

| | | |
|---|---|---|
| CN | 209592039 U | 11/2019 |
| JP | 2005203387 A | 7/2005 |
| KR | 1020090114836 A | 11/2009 |
| WO | 2012087580 A2 | 6/2012 |

OTHER PUBLICATIONS

INPI Search Report and Written Opinion for FR 1851615 dated Oct. 25, 2018 (7 pages).
Baine, et al.: "Cross-Talk Suppression in SOI Substrates," Solid State Electron, Elsevier Science Publishers Barking GB vol. 49 No 9 Sep. 1, 2005 pp. 1461-1465.
EP Search Report and Written Opinion for co-pending EP Appl. No. 19157369.0 dated Mar. 29, 2019 (7 pages).
First Office Action and Search Report for counterpart CN Appl. No. 201910132573.2, report dated Nov. 16, 2023, 6 pgs.

* cited by examiner

INTEGRATED CIRCUIT COMPRISING A SUBSTRATE EQUIPPED WITH A TRAP-RICH REGION, AND FABRICATING PROCESS

CROSS REFERENCE TO RELATED APPLICATIONS

This application is a divisional of U.S. application for patent Ser. No. 16/278,313, filed Feb. 18, 2019, which claims the priority benefit of French Application for Patent No. 1851615, filed on Feb. 23, 2018, the contents of which are hereby incorporated by reference in their entireties to the maximum extent allowable by law.

TECHNICAL FIELD

The invention relates to the field of electronics and, more precisely, to the field of semiconductor substrates which allow electronic circuits, in particular electronic circuits dedicated to radiofrequency applications, to be produced.

In particular, embodiments and methods of implementation relate to silicon-on-insulator (SOI) substrates dedicated to radiofrequency applications and more particularly to fully depleted silicon-on-insulator (FD-SOI) substrates.

BACKGROUND

An SOI substrate conventionally comprises a semiconductor film (or upper semiconductor layer) that is located above a buried insulating layer (generally of silicon oxide), which is commonly referred to as a BOX (acronym standing for "Buried OXide"), that itself is located above a carrier substrate such as a bulk substrate, for example.

Radiofrequency integrated circuits (RF) are generally and preferably fabricated on p-doped HR semiconductor substrates, HR standing for high resistivity (typically indicating a resistivity higher than 1 kohm·cm), so as to limit losses in the substrate and crosstalk between neighboring components, by conduction.

It is furthermore commonplace to employ HR substrates of SOI (silicon-on-insulator) type. The passive or active components formed in and on the semiconductor film are then insulated from the carrier substrate by the buried oxide layer.

However, it has been observed that although employing such substrates decreases losses associated with the substrate, it does not completely prevent losses from occurring. Specifically, fixed electric charges are inevitably present in the buried insulating layer (BOX) because of the process used to fabricate this oxide layer. They are responsible for the accumulation, in the substrate, in the vicinity of the BOX, of mobile electric charges that are able to form a conductive channel. Thus, although HR type substrates are employed, parasitic surface conduction in the substrate remains a source of electrical losses.

The semiconductor-film/BOX/carrier-substrate stack furthermore behaves as a MOS (Metal Oxide Semiconductor) capacitor. To a first approximation, the thickness of the inversion layer associated with this MOS capacitor varies inversely with the square root of the dopant concentration of the carrier substrate. It will therefore be understood that this thickness increases if the carrier substrate is of HR type, i.e. weakly doped. This capacitor has the characteristic of being modulated by the electrical potential applied to the components formed in or on the insulated silicon film, facing and above the BOX. This modulated parasitic capacitor is responsible for harmonic distortion and crosstalk that affects the RF components of the integrated circuits, in a way that is detrimental to the performance of these components. Such distortion may in particular be quantified by the third-order-intercept-point (abbreviated TOIP or IP3) method.

In order to remedy this effect, it is known to use more complex carrier-substrate structures that incorporate a specific region separating the single-crystal portion of the carrier substrate and the buried insulating layer (BOX) so as to create, in proximity to the latter, a high density of surface states liable to trap free charge carriers. This trapping of free charge carriers with surface states greatly decreases the parasitic surface-conduction effect. It furthermore leads to Fermi level pinning in the semiconductor, at the carrier-substrate/BOX interface, this making the capacitance of the parasitic MOS capacitor largely independent of the electrical potential applied to the components formed facing, above the buried insulating layer (BOX), thus limiting harmonic distortion. Such specific regions are known to those skilled in the art as trap-rich regions. Such a substrate is qualified a trap-rich substrate.

Trap-rich regions and their production have been the subject of many publications, among which mention may be made of: Raskin, "SOI technology: An Opportunity for RF Designers," Journal of Telecommunications and Information Technology, April, 2009 and U.S. Pat. No. 9,929,039, both references incorporated by reference, which describe production of a trap-rich charge-trapping region under the buried insulating layer (BOX) of an SOI substrate.

However, production of an integrated circuit in and on the semiconductor film includes high-temperature annealing steps, typically at temperatures largely above 1000° C., in particular with a view to forming shallow trench isolations (STIs). However, such anneals lead to the creation of roughness at the upper surface of the trap-rich region, which results in roughness in the semiconductor film, this being detrimental to the correct operation of certain components of the integrated circuit.

The placement of the trap-rich region under the buried insulating layer in an SOI substrate proves to be even more problematic if the substrate is of FD-SOI type because then the thickness of the semiconductor film is particularly small, typically a few nanometers. Likewise, the thickness of the buried insulating layer (BOX) is small, typically about 15 to 25 nm.

There is therefore a need to provide an SOI and in particular an FD-SOI substrate for which the presence of a trap-rich region is not detrimental to the surface finish of the semiconductor film of such a substrate.

SUMMARY

According to one aspect, an integrated circuit is provided including a substrate which includes at least one first domain and at least one second domain that is different from said at least one first domain, wherein the substrate contains a trap-rich region in said at least one second domain but not in said at least one first domain.

Thus, in contrast to the prior art, the production of a trap-rich region is localized to only certain locations of the substrate.

According to one embodiment, said at least one first domain contains at least one non-radiofrequency component and said at least one second domain contains at least one radiofrequency component.

A radiofrequency component is a component that is capable of being coupled to (for example passed through by)

at least one radiofrequency signal during the operation of the integrated circuit. Such a component is for example, but without limitation, a passive component such as an inductor, capacitor, resistor, or even a waveguide.

A non-radiofrequency component is a component that is different from a radiofrequency component, typically a component that is not intended to be coupled to a radio signal, for example a transistor belonging to a logic portion of the integrated circuit.

According to one embodiment, the substrate is a silicon-on-insulator substrate including, in said at least one first domain, a semiconductor film, a first portion of a carrier substrate and a buried insulating layer located between said first portion of the carrier substrate and the semiconductor film, and including, in said second domain, a second portion of the carrier substrate, which portion is surmounted by said trap-rich region, the semiconductor film and said buried insulating layer not extending into said at least one second domain.

According to one embodiment, the substrate is a fully depleted silicon-on-insulator substrate, the semiconductor film including a fully depleted semiconductor.

The trap-rich region is therefore present only in a domain comprising radiofrequency components. This presence is advantageous because it allows the harmonic distortion and the crosstalk that affects the radiofrequency components of said domains of the integrated circuit to be limited.

Furthermore, this presence does not affect the surface roughness of the semiconductor film of an SOI substrate and in particular an FD-SOI substrate, because in the second (radiofrequency) domain the semiconductor film is not present. Furthermore, the roughness of the semiconductor film of an SOI and in particular FD-SOI substrate is not impacted in the first domain (non-radiofrequency domain) by the trap-rich region, which is absent, this absence not adversely affecting correct operation of the non-radiofrequency components.

A trap-rich region is a region the denomination (i.e. "trap-rich") and the structure of which are well known to those skilled in the art on account of the many publications already written on the subject.

This being so, it is also possible to define, by way of a non-limiting example, a trap-rich region as being a region that, when it is located under a radiofrequency component that is being passed through by a radiofrequency signal, leads to an attenuation of at least 85 dBm of the second harmonic of this signal.

According to one embodiment, said trap-rich region comprises at least one stack including a polycrystalline semiconductor layer, and an interface zone that is located between a subjacent portion of the substrate and the polycrystalline semiconductor layer, said interface zone having a different structure from the crystal structure of said polycrystalline semiconductor layer, and from the crystal structure of the subjacent portion of the substrate.

According to one embodiment, said at least one polycrystalline semiconductor layer has a thickness comprised between 0.5 and 3 µm.

According to one embodiment, when the substrate is an SOI substrate, the subjacent portion of the substrate is said second portion of the carrier substrate.

According to one embodiment, the carrier substrate comprises a high-resistivity substrate.

A high-resistivity substrate is a weakly doped substrate that typically has a resistivity higher than 1 kohm·cm.

This type of substrate is in particular appreciated for the production of radiofrequency components because it limits losses in the substrate and crosstalk between neighboring components, by conduction.

According to another aspect, a process is also provided for producing an integrated circuit including producing a trap-rich region only in a first portion of a substrate of the integrated circuit.

According to one method of implementation, the process comprises producing a first domain containing at least one non-radiofrequency component and producing a second domain containing at least one radiofrequency component and the trap-rich region.

According to one method of implementation, the process comprises producing isolating zones in the substrate, these zones being produced after the trap-rich region has been produced.

According to one method of implementation, the substrate is a silicon-on-insulator substrate comprising a semiconductor film, a carrier substrate and a buried insulating layer located between the carrier substrate and the conductive film, and the production of the trap-rich region includes:

producing a trench in said at least one second domain extending as far as into the carrier substrate;

forming at least one interface zone in the internal wall of said trench, said interface zone having a different crystal structure from the carrier substrate; and forming at least one polycrystalline semiconductor layer in said at least one interface zone, the polycrystalline semiconductor layer forming said trap-rich region having an upper surface located substantially in the same plane as the upper surface of the semiconductor film, and having a different structure from the crystal structure of the interface zone.

When a surface is said to be located substantially in the same plane as another surface, what is meant is that is located in the same plane to within a tolerance, this tolerance being related to characteristics of the technological processes implemented to obtain the surfaces.

According to one method of implementation, the substrate is a fully depleted silicon-on-insulator substrate, the semiconductor film including a fully depleted semiconductor.

According to one method of implementation, the carrier substrate includes a high-resistivity substrate.

BRIEF DESCRIPTION OF THE DRAWINGS

Other advantages and features of the invention will become apparent on examining the detailed description of embodiments and methods of implementation, which are in no way limiting, and the appended drawings, in which.

DETAILED DESCRIPTION

Of course, to facilitate comprehension, the various elements shown in the figures, and in particular the layers composing the silicon-on-insulator substrate have been shown schematically, and the proportions of these various elements may be different from their actual real-life proportions.

Figure 1:
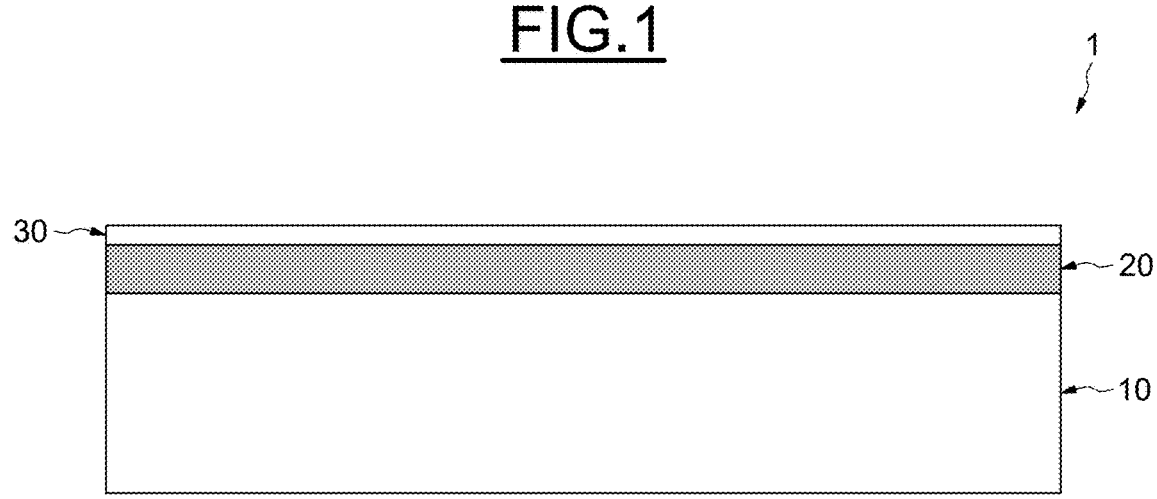
FIGS. 1 to 6 schematically illustrate one method of implementation of a process and one embodiment of an integrated circuit.

FIG. 1 shows a cross-sectional view of a silicon-on-insulator (SOI) substrate.

The SOI substrate comprises, as is conventionally the case, a semiconductor film 30 that is located above a buried insulating layer 20 (generally of silicon oxide), which is commonly referred to as a BOX (acronym standing for "Buried OXide"), that itself is located above a carrier substrate 10.

In this example, the substrate is in particular an FD-SOI substrate, although the illustrated embodiment may be applied to any type of SOI substrate.

For an FD-SOI substrate, the material forming the semiconductor film, typically silicon, is fully depleted. In this respect, the material has an intrinsic doping density typically of about $10^{15}$ dopant atoms per $cm^3$. The thickness of the semiconductor film 30 may be comprised between 5 and 6 nm, and the thickness of the insulating layer 20 may be approximately 25 nm.

The carrier substrate 10 may be made from any semiconductor, and in particular be based on single-crystal silicon.

The carrier substrate 10 is here advantageously a high-resistivity semiconductor substrate, i.e. a relatively weakly doped substrate, and typically has a resistivity higher than 1 kohm·cm. This type of substrate is in particular appreciated for the production of radiofrequency components.

Of course, this does not exclude the possibility of using another type of substrate that is not of high resistivity.

Figure 2:
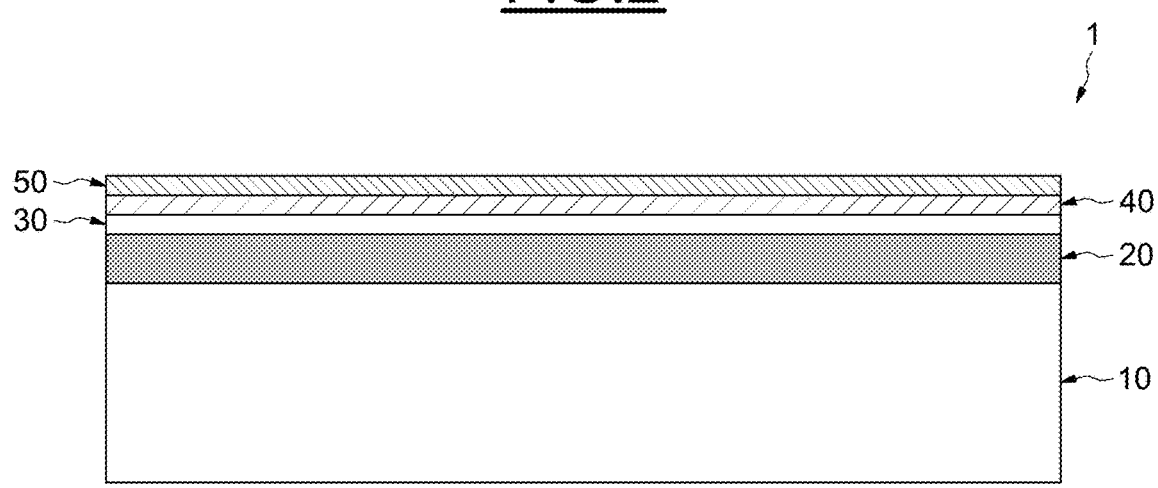

In FIG. 2, a hard-mask layer 40 has been deposited on the top side of the semiconductor film 30. This layer is in particular intended to protect the semiconductor film 30 and will also serve, as will be seen below, as an etch mask.

This layer 40 may, for example, be made of silicon nitride, oxide-nitride-oxide (ONO) or any other suitable material.

A photoresist layer 50 has been deposited on the top side of the hard-mask layer 40.

Figure 3:
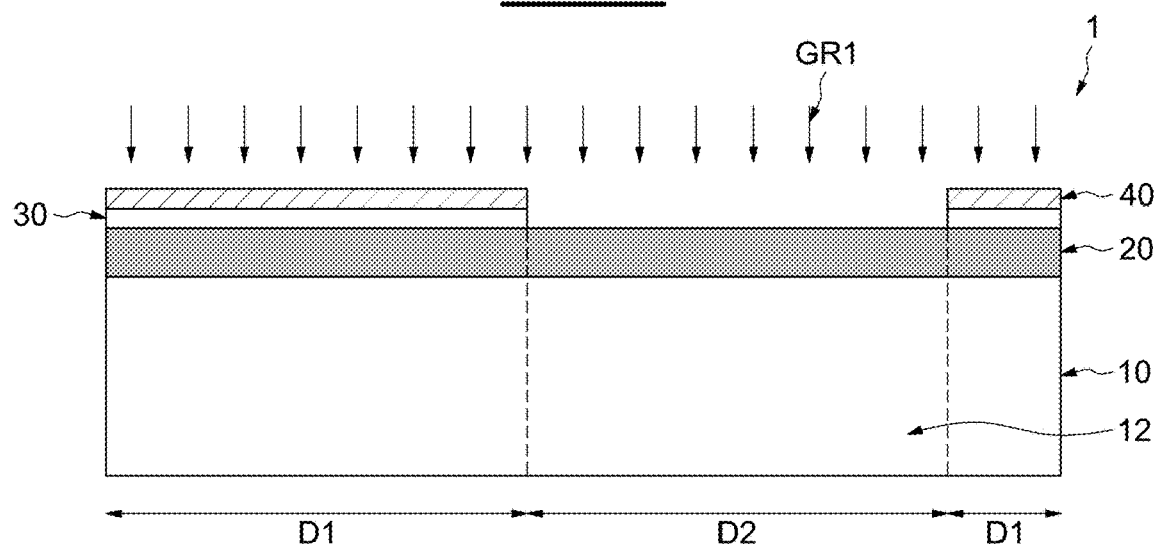

As illustrated in FIG. 3, the integrated circuit that will be produced in and on the substrate 1 includes a plurality of domains.

More precisely, a first domain D1 is intended to receive non-radiofrequency components whereas a second domain D2 is intended to receive radiofrequency components.

Of course, each domain may be formed of one and the same zone or indeed of a plurality of separate zones.

As illustrated in FIG. 3, the process continues, with a view to defining the extent of the domain D2, with a conventional step of photolithography, exposure and development of the resist layer 50 and then, using the remainder of the resist as an etch mask, with a conventional etch GR1, which is known per se, of the hard-mask layer 40.

The upper surface of the buried insulating layer located above the portion 12 of the carrier substrate is then uncovered.

The resist layer 50 is then removed.

Figure 4:
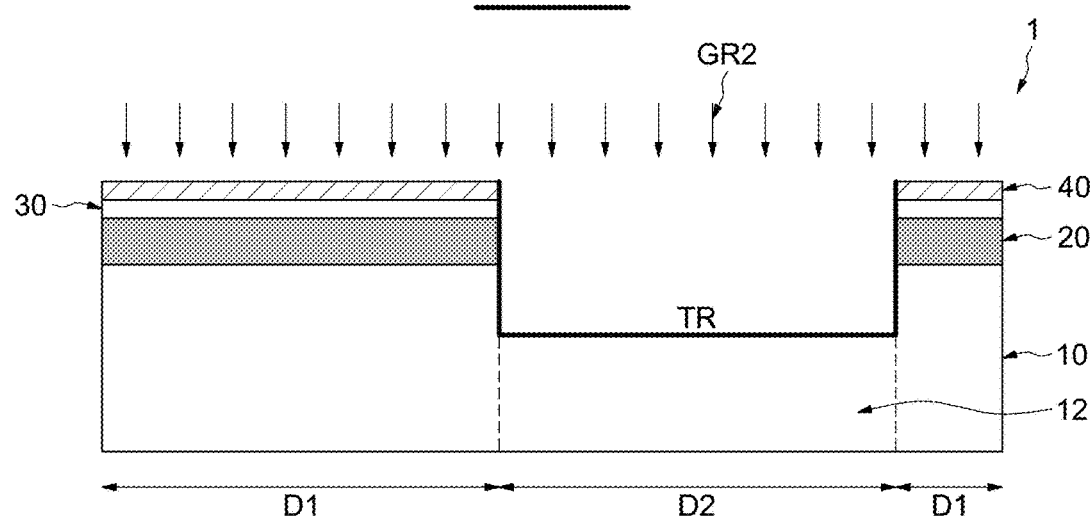

As illustrated in FIG. 4, conventional etching operations GR2, which are known per se, are then carried out to form a trench TR that extends as far as into the portion 12 of the carrier substrate 10 (i.e., completely through layers 20 and 30 and partially into substrate 10).

The trench TR has a depth that is, for example, comprised between 0.5 and 2 μm.

This trench TR represents the future location of a trap-rich region.

Thus, this trap-rich region will be located only in the domain D2, which will advantageously contain radiofrequency components.

This presence is advantageous because it allows the harmonic distortion and crosstalk that affects the radiofrequency components of the domain D2 of the substrate 1 to be limited.

This presence does not affect the surface roughness of the semiconductor film 30 of the domain D2 of the FD-SOI substrate 1, because in the (radiofrequency) domain D2, the semiconductor film 30 is not present.

In contrast, even though the semiconductor film 30 is present in the domain D1 of the substrate 1, its roughness is not impacted by the trap-rich region, because it is absent therefrom, this absence not adversely affecting correct operation of the non-radiofrequency components.

Figure 5:
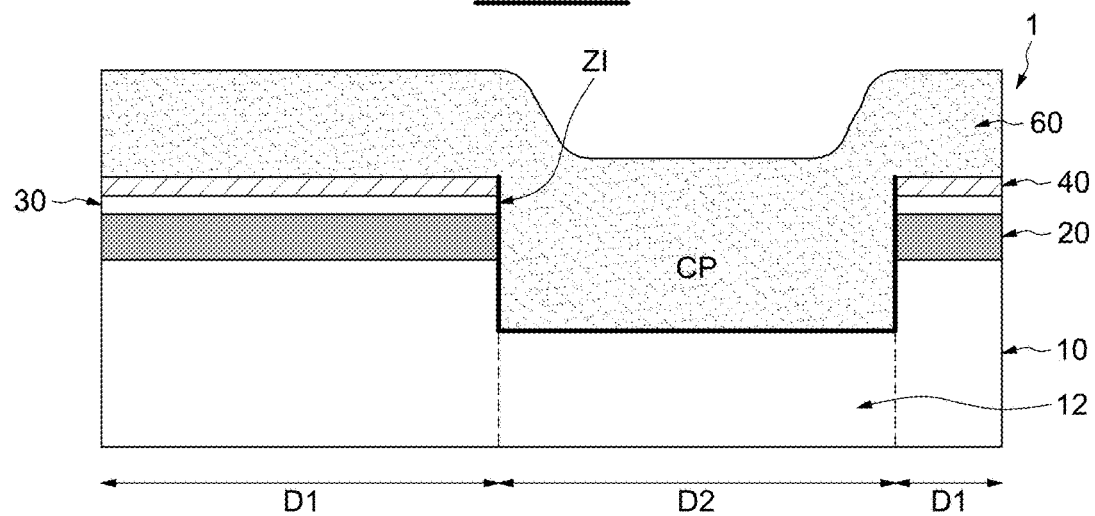

As illustrated in FIG. 5, a polycrystalline semiconductor layer 60 is deposited on the upper side of the hard-mask layer 40 and on the wall of the trench TR, so as to fill the trench and form a trap-rich region CP.

To avoid epitaxial growth of the polycrystalline semiconductor layer 60 on the subjacent single-crystal carrier substrate 12, it is advisable to form an interface zone ZI on the internal wall of the trench TR before the polycrystalline semiconductor layer 60 is deposited. This allows the polycrystalline semiconductor layer to be formed without epitaxial lattice matching and, therefore, the traps that lead to the formation of the trap-rich region to form.

Various techniques may be employed to form the interface zone ZI. Thus it is possible to expose the wall of the trench TR to an environment containing oxidizing species.

The effects of the oxidation create, in the internal wall (i.e., sidewalls and bottom) of the trench TR, a layer ZI of very small thickness of the order of one nanometer, which has a structure that is different from the crystal structure of the grains of the polycrystalline semiconductor 60 and from the subjacent single-crystal carrier substrate 12.

This oxidation may be achieved via a controlled thermal oxidation of the rapid-thermal-oxidation (RTO) type, i.e. oxidation the rate of which is increased by heating the internal wall TR, typically to a temperature between 550° C. and 900° C., in the presence of an oxidizing atmosphere.

It is also possible to achieve this oxidation by carrying out a wet chemical oxidizing treatment using any conventional processing method.

Among the other possible ways of producing the interface zone ZI mention may be made of the ion implantation of non-doping species such as argon, germanium or any other heavy ion. Such an ion bombardment allows a large number of crystal defects to be created in the internal wall of the trench TR, or said internal wall to be at least partially amorphized, i.e. the crystalline arrangement at the surface of the grains to be broken, thereby allowing epitaxial growth during the deposition of the polycrystalline semiconductor 60 to be avoided.

Thus, once the interface layer ZI has been produced, the polycrystalline semiconductor layer 60 may be deposited in the trench TR and on the hard-mask layer 40.

The polycrystalline semiconductor layer CP may be deposited using a chemical-vapor-deposition technique, so as to form a layer the thickness of which is preferably comprised between 500 nanometers and 2000 nanometers or indeed more, 3000 nanometers for example.

Optionally, after it has been deposited, the polycrystalline semiconductor layer 60 may undergo a heat treatment tailored to its thickness and to its nature, so as to stabilize its structure by recrystallizing it.

Of course, other deposition techniques may be employed to form this layer, for example low-pressure chemical vapor deposition (LPCVD), or more generally any type of deposition technique known to allow polycrystalline semiconductor layers to be produced.

A plurality of "polycrystalline-semiconductor-layer/interface-zone" stacks could be produced to form the trap-rich region CP.

Figure 6:
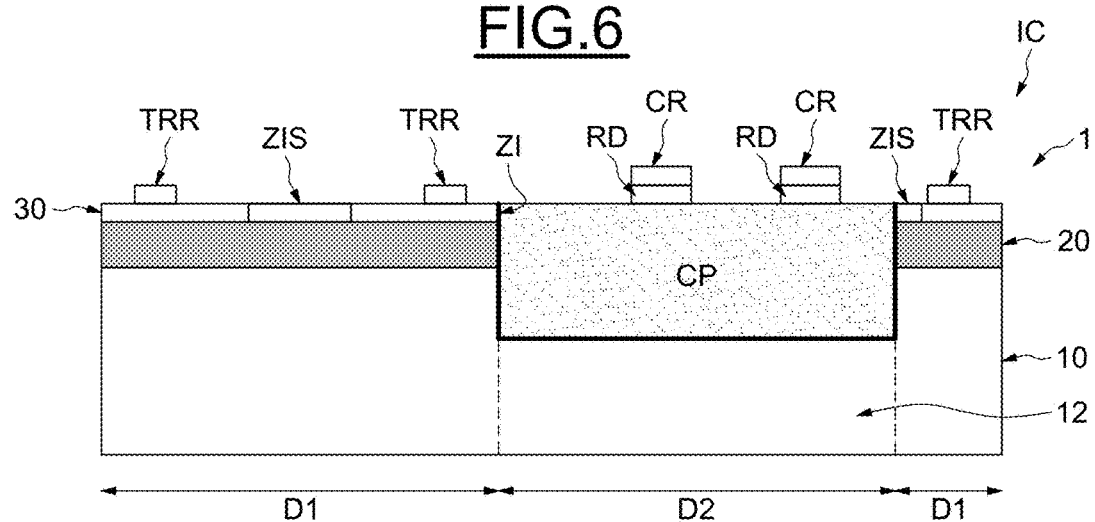

Subsequently, as illustrated in FIG. 6, the polycrystalline semiconductor layer 60 is planarized, for example by chemical mechanical planarization (CMP). The hard-mask layer 40 is also removed.

The steps used to form the integrated circuit are carried out on the whole of a semiconductor wafer. These steps are what are called "wafer scale" operations.

Thus, it is possible, before the polycrystalline semiconductor layer 60 is planarized by chemical mechanical polishing, to partially etch the layer 60 in the domain D1 with the aim of removing the polycrystalline semiconductor layer 60 present in this domain.

This method allows the need to subsequently carry out wafer-scale planarization of a very large area, which may lead to dips forming in certain locations, to be avoided.

After the hard mask layer 40 has been removed, a sill remains between the upper portion of the semiconductor film 30 and the upper portion of the trap-rich region CP. It is possible to leave the sill as such or to remove the sill, preferably corresponding to the thickness of the hard-mask layer 40, locally.

Next, as illustrated in FIG. 6, isolating regions ZIS, for example corresponding to shallow trench isolations, or to a local oxide (LOCOS for "LOCal Oxidation of Silicon"), are produced in the semiconductor film 13.

Next, in a conventional way, non-radiofrequency components TRR, transistors for example, are produced in the domain D1, and, also, in a conventional way, radiofrequency components CR, inductors for example, are produced in the domain D2. These radiofrequency components are in practice separated from the trap-rich region by a dielectric region RD, which is generally thick. When these components are for example produced in the first metallization level of the integrated circuit, the region RD is the region known to those skilled in the art as the "PMD region" (PMD: PreMetal Dielectric).

Next, the fabrication of the integrated circuit IC is completed with usual and conventional steps well known by those skilled in the art and which are not shown here for the sake of simplicity.

As illustrated in FIG. 6, the integrated circuit IC here comprises the FD-SOI substrate 10, the first domain D1 and the second domain D2. The substrate contains a trap-rich region only in the second domain D2.

The first domain D1 includes a semiconductor film 30 on which non-radiofrequency components TRR are present.

The second domain D2 includes, apart from the trap-rich region CP, radiofrequency components CR formed on the top side of said trap-rich region CP. The trap-rich region CP is separated from the second portion 12 of the carrier substrate 10 by the interface zone ZI.

The invention is not limited to these methods of implementation but encompasses any variant thereof. For example, although an SOI substrate has been described, the invention is applicable to a bulk substrate comprising a trap-rich region only in certain locations.

The invention claimed is:

1. A process for producing an integrated circuit, comprising:
    providing a silicon-on-insulator substrate including a semiconductor film, a carrier substrate and a buried insulating layer located between the carrier substrate and the semiconductor film;
    producing a trap-rich region surmounted on the carrier substrate in a first portion of the silicon-on-insulator substrate;
    wherein a second portion of said silicon-on-insulator substrate does not include said trap rich region;
    wherein the semiconductor film and the buried insulating layer do not extend into the first portion;
    producing in a first domain associated with said first portion of the silicon-on-insulator substrate that does include said trap rich region at least one radiofrequency component; and
    producing in a second domain associated with said second portion of said silicon-on-insulator substrate at least one non-radiofrequency component.

2. The process according to claim 1, further comprising producing isolating zones in the silicon-on-insulator substrate, wherein producing the isolating zones is performed after the trap-rich region has been produced.

3. The process according to claim 1, wherein the producing the trap rich region comprises:
    forming a trench extending through the semiconductor film and the buried insulating layer and into the carrier substrate;
    forming at least one interface zone in an internal wall of said trench, said interface zone having a crystal structure different from the carrier substrate; and
    forming at least one polycrystalline semiconductor layer on said at least one interface zone, the polycrystalline semiconductor layer providing said trap-rich region.

4. The process according to claim 3, wherein said internal wall of said trench comprises a side wall and a bottom wall of said trench.

5. The process according to claim 3, wherein said at least one polycrystalline semiconductor layer has a structure different from the crystal structure of the at least one interface zone.

6. The process according to claim 3, further comprising processing said at least one polycrystalline semiconductor layer to have an upper surface located substantially in a same plane as an upper surface of the semiconductor film.

7. The process according to claim 3, wherein said at least one polycrystalline semiconductor layer has a thickness comprised between 0.5 and 3μm.

8. The process according to claim 1, wherein the silicon-on-insulator substrate is a fully depleted silicon-on-insulator substrate, the semiconductor film including a fully depleted semiconductor material.

9. The process according to claim 1, wherein the carrier substrate is a high-resistivity substrate.

10. The process according to claim 1, wherein trap-rich region is formed of a polycrystalline semiconductor material.

11. A process for producing an integrated circuit, comprising:
    providing a silicon-on-insulator substrate including a semiconductor film, a carrier substrate and a buried insulating layer located between the carrier substrate and the semiconductor conductive film;
    forming a trench extending through the semiconductor film and the buried insulating layer and into the carrier substrate;
    filling said trench with a polycrystalline semiconductor material to provide a trap-rich region in the silicon-on-insulator substrate that is not covered by the semiconductor film and the buried insulating layer;
    forming a premetallization dielectric layer over the trap-rich region;
    producing metallization layers over the premetallization dielectric layer which include at least one radiofrequency component; and producing at least one non-radiofrequency component in or on the semiconductor film.

12. The process according to claim 11, wherein filling said trench comprises:
   conformally depositing a layer of polycrystalline semiconductor material; and
   planarizing said layer so that an upper surface of the polycrystalline semiconductor material filling said trench is coplanar with an upper surface of the semiconductor film.

13. The process according to claim 11, further comprising, before conformally depositing, oxidizing side walls and a bottom of the trench to form an interface layer.

14. The process according to claim 11, further comprising, before conformally depositing, forming an interface layer on side walls and a bottom of the trench.

15. The process according to claim 14, wherein the interface layer has a crystal structure that is different than a crystal structure of materials at the side walls and bottom of the trench.

16. The process according to claim 11, wherein the silicon-on-insulator substrate is a fully depleted silicon-on-insulator substrate, the semiconductor film including a fully depleted semiconductor material.

17. The process according to claim 11, wherein the carrier substrate is a high-resistivity substrate.

* * * * *

UNITED STATES PATENT AND TRADEMARK OFFICE
CERTIFICATE OF CORRECTION

PATENT NO. : 11,978,710 B2
APPLICATION NO. : 17/359872
DATED : May 7, 2024
INVENTOR(S) : Didier Dutartre Page 1 of 1

It is certified that error appears in the above-identified patent and that said Letters Patent is hereby corrected as shown below:

In the Specification

At Column 2, Line 24, [[SOT]] should be corrected to read -- SOI --

At Column 2, Line 29, [[SOT]] should be corrected to read -- SOI --

Signed and Sealed this
Twenty-third Day of December, 2025

John A. Squires
*Director of the United States Patent and Trademark Office*